US008202391B2

(12) United States Patent
Egawa

(10) Patent No.: US 8,202,391 B2
(45) Date of Patent: Jun. 19, 2012

(54) CAMERA MODULE AND METHOD OF MANUFACTURING CAMERA MODULE

(75) Inventor: Yoshimi Egawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 405 days.

(21) Appl. No.: 12/461,088

(22) Filed: Jul. 31, 2009

(65) Prior Publication Data

US 2010/0038017 A1 Feb. 18, 2010

(30) Foreign Application Priority Data

Aug. 14, 2008 (JP) ................................. 2008-208887

(51) Int. Cl.
*B32B 37/00* (2006.01)
(52) U.S. Cl. .................................. 156/273.5; 156/272.2
(58) Field of Classification Search ............... 156/272.2, 156/273.5, 60
See application file for complete search history.

(56) References Cited

FOREIGN PATENT DOCUMENTS

| JP | 6-331869 A | * | 12/1994 |
| JP | 2006-128755 A | * | 5/2006 |
| JP | 2006-128931 A | * | 5/2006 |
| JP | 2007-036481 A | | 2/2007 |

OTHER PUBLICATIONS

Machine translation of JP 2006-128931, date unknown, 8 pages.*
Machine translation of JP 6-331869, date unknown, 5 pages.*
Machine translation of JP 2006-128755, date unknown, 13 pages.*

* cited by examiner

*Primary Examiner* — Jeff Aftergut
(74) *Attorney, Agent, or Firm* — Rabin & Berdo, P.C.

(57) ABSTRACT

There is provided a method of manufacturing a camera module including a sensor package having an image pickup element, and a lens configuration in which a lens holder, and a receptacle accommodating the sensor package are integrally formed, the sensor package being fixed within the receptacle, the method including: applying a photo-curing resin to predetermined portions of the receptacle; performing alignment of a relative position of the sensor package to the lens configuration; a first joining whereby the photo-curing resin is cured so that the sensor package is fixed within the receptacle while maintaining the relative position of the sensor package to the lens configuration; and a second joining whereby a thermosetting resin is applied so as to fill a space formed between the sensor package and the lens configuration, and then curing the thermosetting resin.

6 Claims, 8 Drawing Sheets

FIG. 4-A1
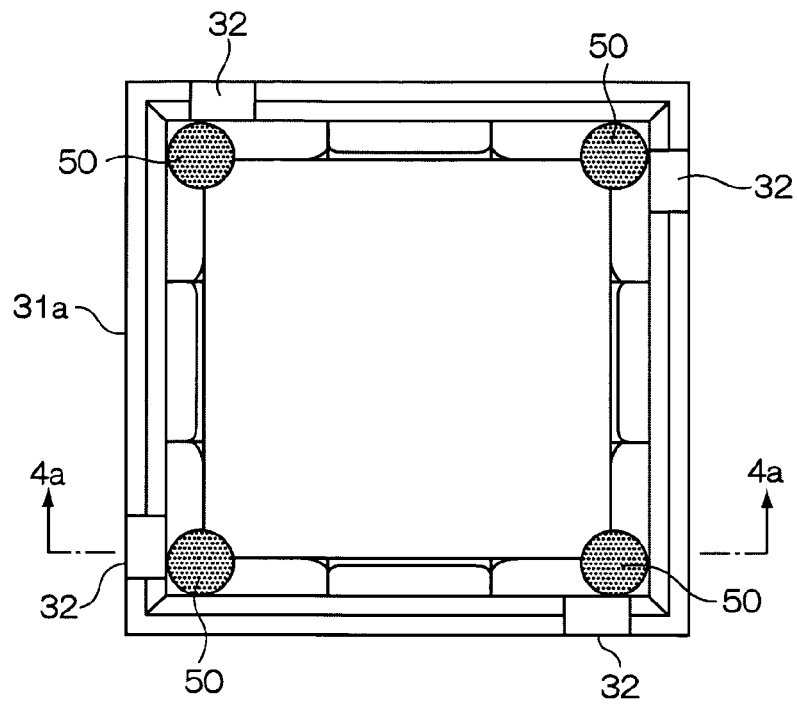
(a1)
FIG. 4-A2
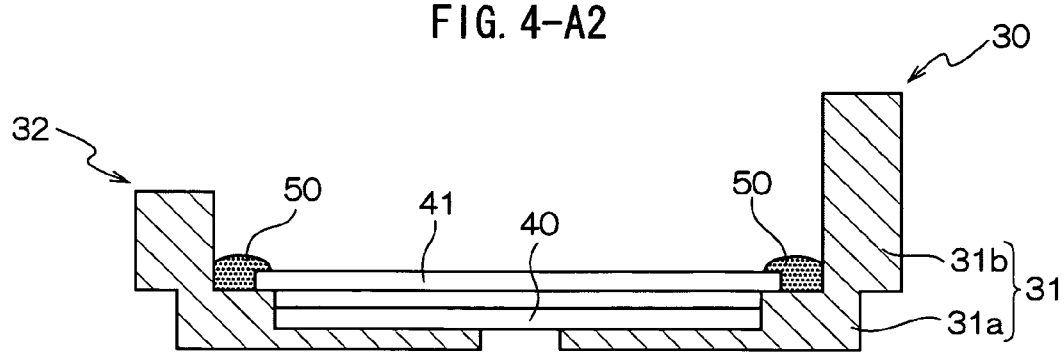
(a2)

FIG. 4-B1
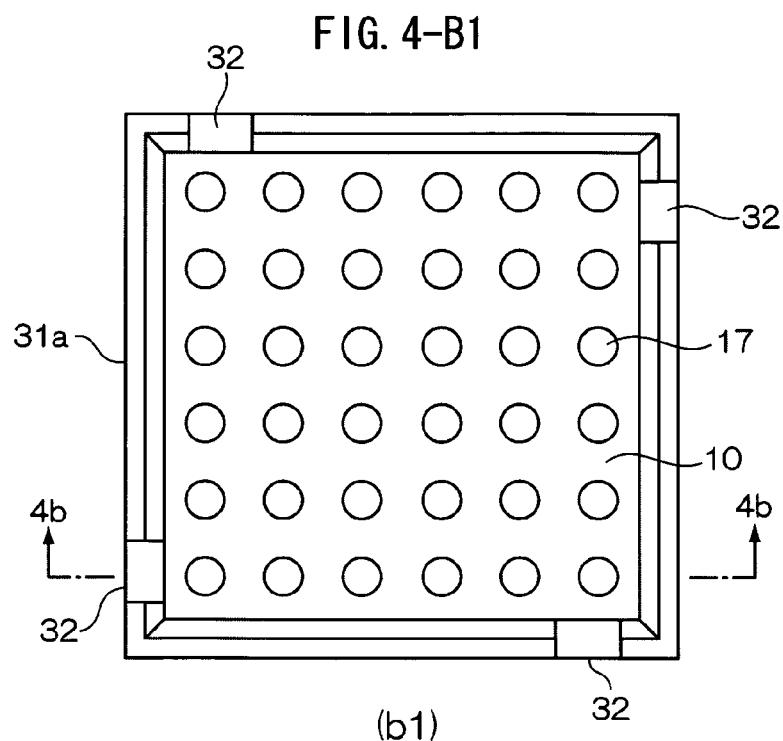
(b1)
FIG. 4-B2
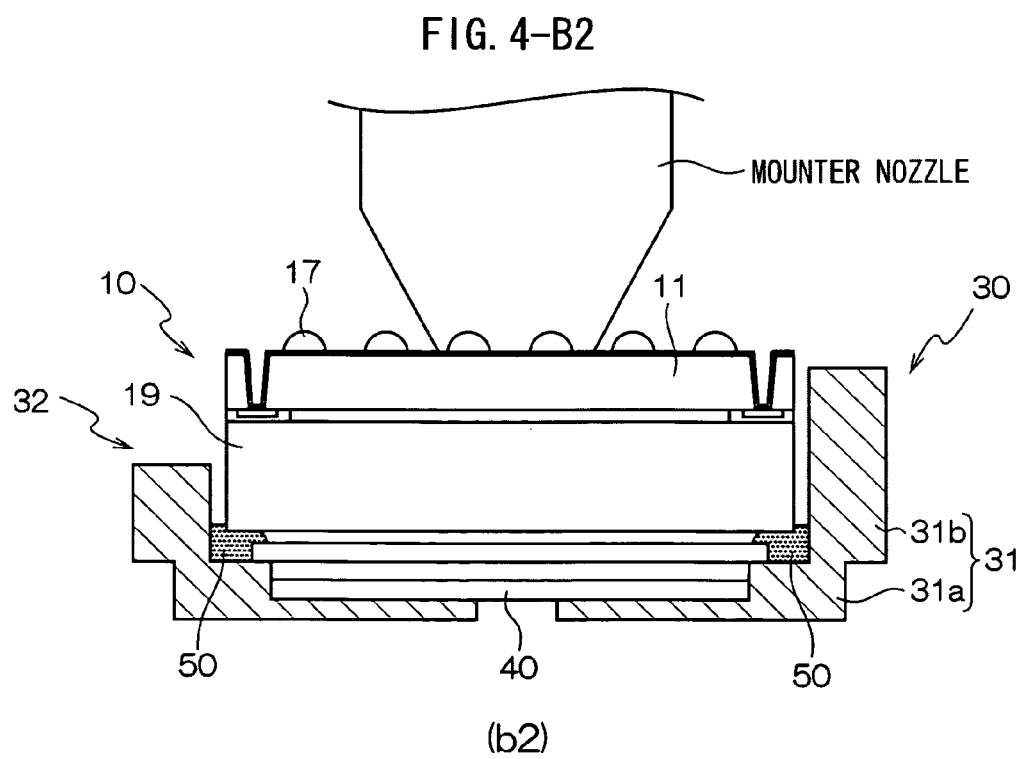
(b2)

FIG. 5-C1
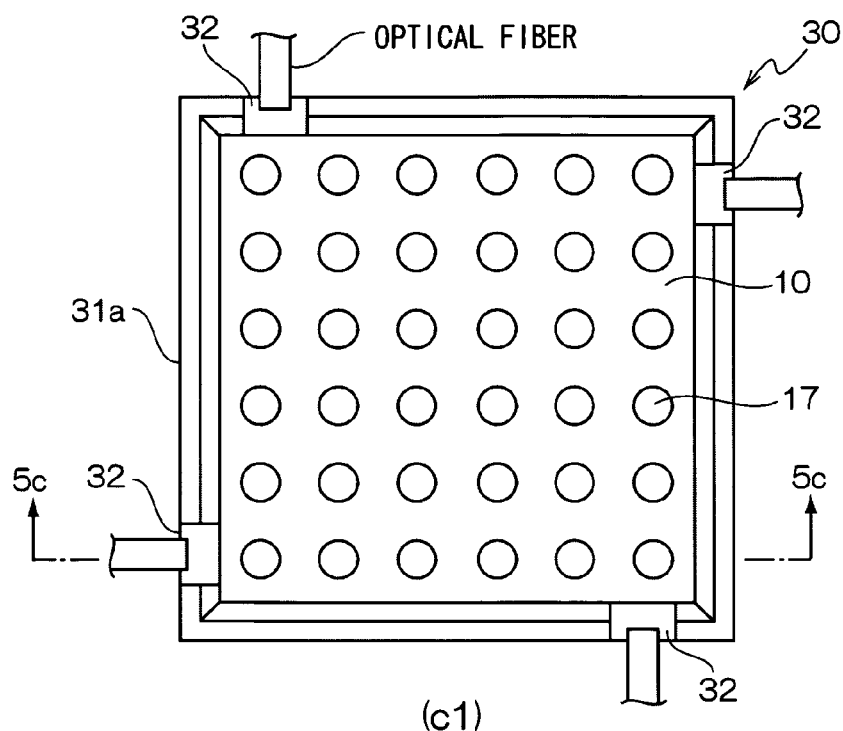
(c1)
FIG. 5-C2
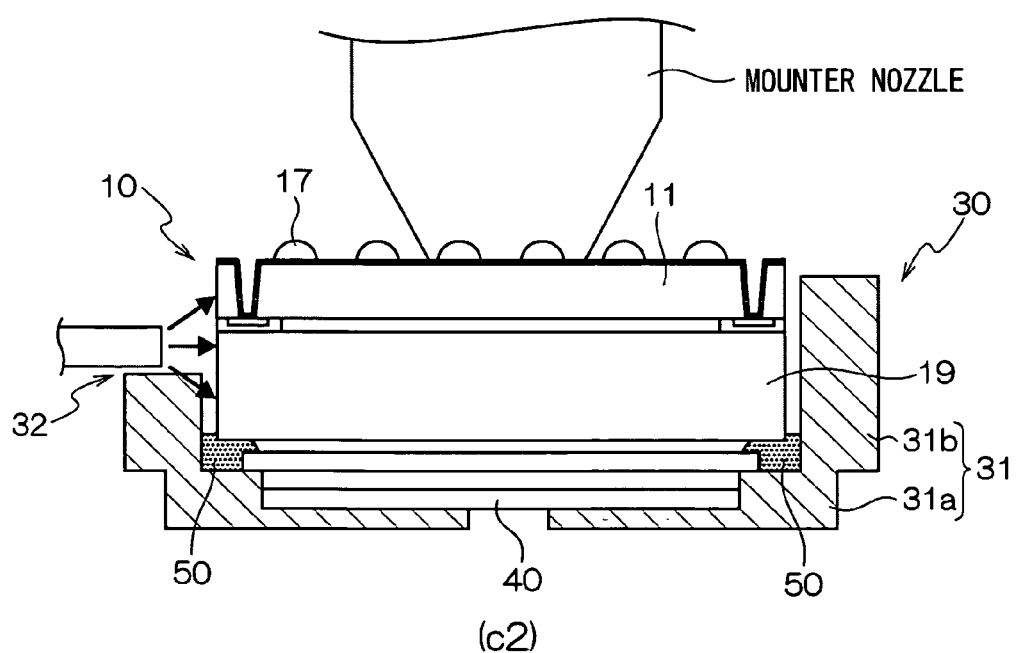
(c2)

FIG. 5-D1
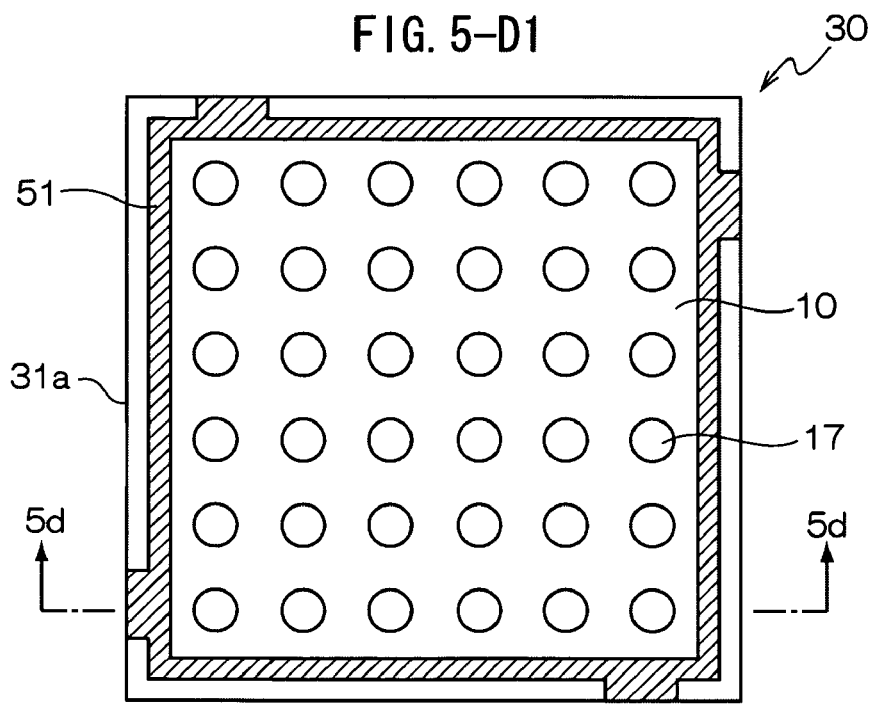
(d1)
FIG. 5-D2
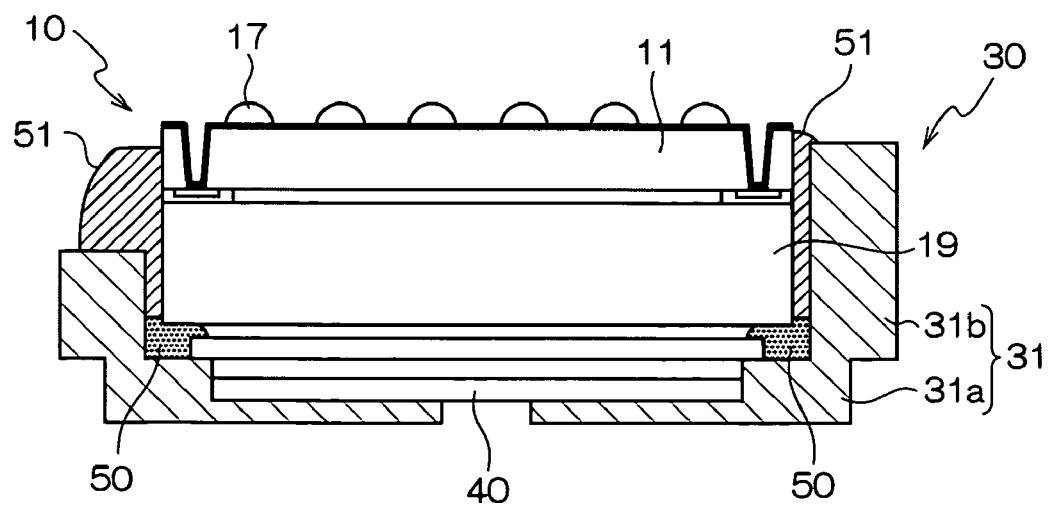
(d2)

CAMERA MODULE AND METHOD OF MANUFACTURING CAMERA MODULE

CROSS-REFERENCE TO RELATED APPLICATION

This application is based on and claims priority under 35 USC 119 from Japanese Patent Application No. 2008-208887 filed on Aug. 14, 2008, the disclosure of which is incorporated by reference herein.

BACKGROUND

1. Technical Field

The present invention relates to a camera module in which image pickup elements and an optical component such as a lens are integrally formed.

2. Related Art

In a mobile device such as mobile phone, a model having a built-in camera is now mainstream. A camera mounted in such a mobile device is required to have small size and small thickness. To achieve this, a camera module is being developed, in which an optical component such as a lens and solid image pickup elements such as CMOS sensors are integrally formed.

Recently, the mobile device tends to be reduced in size more and more, and accordingly further size reduction is required for a camera module. To achieve this, each image pickup element itself to be built in the camera module needs to be reduced in size. Thus, it is attempted that the image pickup element is configured by a technique of W-CSP (Wafer-level Chip Size Package) having penetrating electrodes. When the technique is used, wire bonding, which has been used for a camera module in the past, is unnecessary, enabling reduction in size of the camera module.

JP-A No. 2007-036481 discloses a configuration example of a camera module with a built-in W-CSP-type sensor package having image pickup elements. Cover glass is attached to a light-receiving surface of a semiconductor substrate on which the image pickup elements are formed, and plural of solder balls are provided as external connection terminals on a mounting surface. An optical lens, which focuses light from an imaging object onto light-receiving surfaces of the image pickup elements, is provided on a top of the cover glass. A cylindrical lens holder for holding the optical lens is integrally formed with a shading member, which covers the top and side faces of the cover glass so as to shade areas other than a light-receiving area, and combined with the sensor package.

It is considered to be preferable from a viewpoint of achieving small size and low profile that the camera module having a built-in W-CSP-type sensor package is configured such that a lens structure including a lens holder for holding an optical lens, and a shading member for shading a sensor package, is directly joined to the sensor package. In this case, alignment of a relative position of the sensor package to the lens structure is important. That is, it is necessary that an optical distance between the sensor package and the lens should accurately correspond to a focal distance of the lens. In addition, it is necessary that a center of an effective pixel area of the image pickup elements is allowed to correspond to a light axis of the lens. If the lens structure and the sensor package are simply contacted and joined to each other by an adhesive or the like, a relative position between such components may sometimes deviate from an appropriate range due to variation in outside dimension of each component.

In the case that thermosetting resin is used for joining the lens structure to the sensor package, the following problem has occurred: since relatively long time is taken for heat curing, a relative position of the lens structure to the sensor package is hard to be held during heat curing, leading to variation in the relative position. As a measure for this, use of photo-curing resin is considered for joining the lens structure to the sensor package. However, the sensor package is typically covered with a shading member for the lens structure, and therefore a joint of the lens structure to the sensor package is not exposed to the outside. Therefore, the joint is hardly irradiated with light for curing resin, leading to a problem that the photo-curing resin has been hardly used.

SUMMARY

The present invention was made in the light of the above points, and an object of the invention is to provide a camera module having a sensor package including an image pickup element, and a lens structure including an optical component such as a lens, and a shading member for shading the sensor package, in which alignment of a relative position of the sensor package to the lens structure may be accurately performed, and provide a method of manufacturing the camera module.

One aspect of the present invention provides a method of manufacturing a camera module comprising a sensor package having an image pickup element, and a lens configuration in which a lens holder, which holds a lens that focuses light from an imaging object onto a light receiving surface of the image pickup element, and a receptacle, which accommodates the sensor package, are integrally formed, the sensor package being fixed within the receptacle, the method including:

applying a photo-curing resin to predetermined portions of the receptacle;

performing alignment of a relative position of the sensor package to the lens configuration;

a first joining whereby the photo-curing resin is cured so that the sensor package is fixed within the receptacle while maintaining the relative position of the sensor package to the lens configuration; and a second joining whereby a thermosetting resin is applied so as to fill a space formed between the sensor package and the lens configuration, and then curing the thermosetting resin.

Another aspect of the present invention provides a camera module including:

a sensor package having an image pickup element;

a lens configuration in which a lens holder that holds a lens that focuses light from an imaging object onto a light receiving surface of the image pickup element, and a receptacle that accommodates the sensor package, are integrally formed;

a first joint in which the sensor package is fixed within the receptacle using a photo-curing resin;

a second joint in which the sensor package is fixed within the receptacle using a thermosetting resin;

through holes, each through hole communicating with the inside of the receptacle, at regions near the first joint of the lens configuration, and wherein the sensor package is fixed within the receptacle.

Moreover, in the camera module according to the another aspect of the present invention, the sensor package may be a W-CSP-type package having a penetrating electrode.

According to the method of manufacturing the camera module of the invention, after alignment of a relative position of the sensor package to the lens structure has been performed, such components are joined to each other while holding the adjusted relative position between the components. Therefore alignment accuracy of the relative position of the sensor package to the lens structure may be improved. Since photo-curing resin is used for fixing the relative position between the components, curing time is short, enabling processing in cooperation with a chip mounter. This may avoid a problem that the relative position between the components may vary during curing. UV irradiation windows communicating to the inside of the lens structure are provided, thereby UV light may be introduced to a joint within the lens structure, enabling use of photo-curing resin. In addition, since thermosetting resin is used together, joining strength is ensured.

BRIEF DESCRIPTION OF THE DRAWINGS

Exemplary embodiments of the present invention will be described in detail based on the following figures, wherein:

FIGS. 4-a1, 4-b1 are plan views showing a method of manufacturing the camera module as the example of the invention respectively;

FIGS. 4-a2, 4-b2 are section views along a line 4a-4a and a line 4b-4b in FIGS. 4-a1, 4-b1 respectively;

FIGS. 5-c1, 5-d1 are plan views showing the method of manufacturing the camera module as the example of the invention respectively;

FIGS. 5-c2, 5-d2 are section views along a line 5c-5c and a line 5d-5d in FIGS. 5-c1, 5-d1 respectively;

DETAILED DESCRIPTION

Hereinafter, an example of the present invention will be described with reference to drawings. In the following figures, substantially equal or equivalent components or portions are indicated with the same references.

Figure 1A:
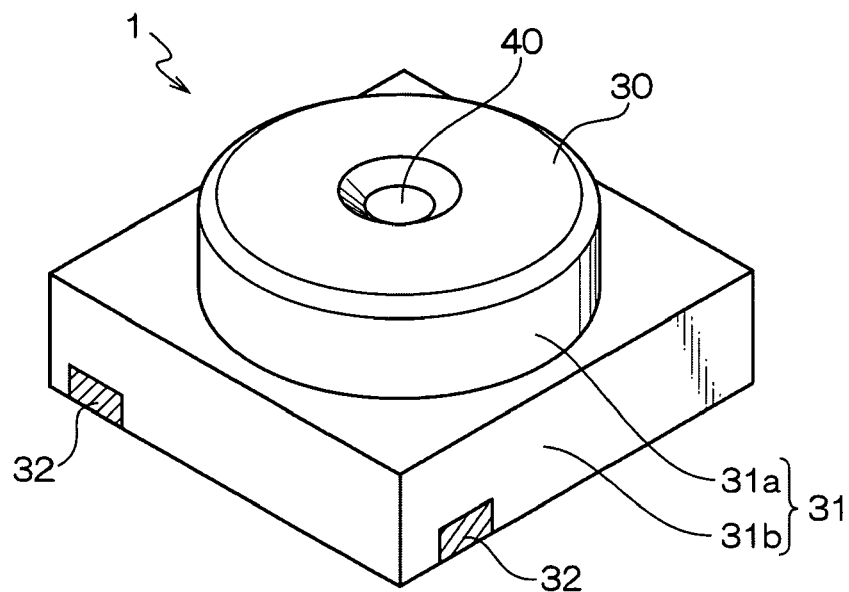
FIG. 1A is a perspective view of a camera module as an example of the invention.
Figure 1B:
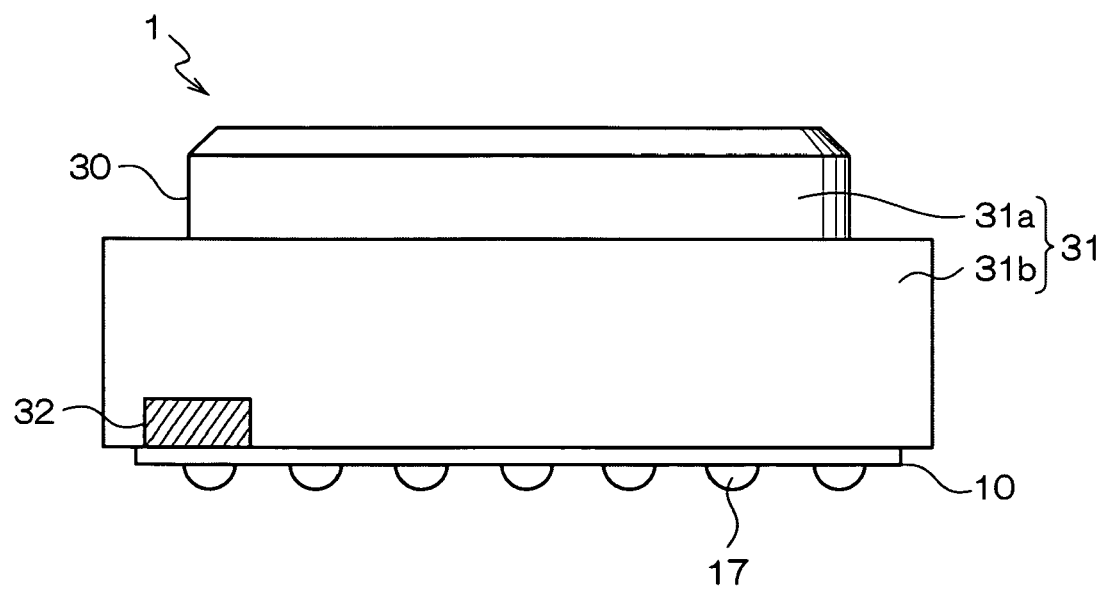
FIG. 1B is a side view of the camera module as the example of the invention.
Figure 2A:
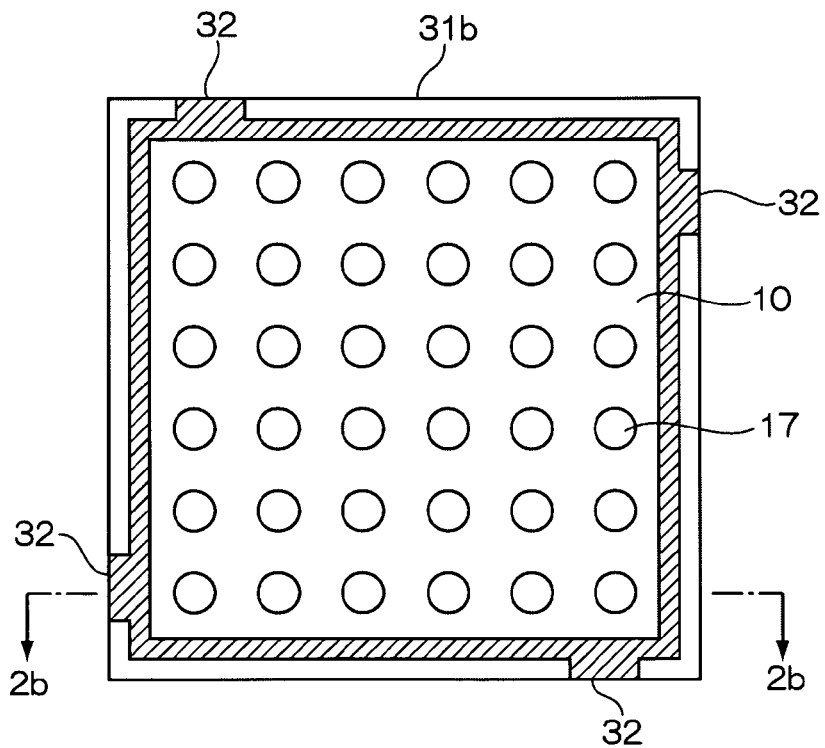
FIG. 2A is a plan view of the camera module as the example of the invention as viewed from a back side thereof.
Figure 2B:
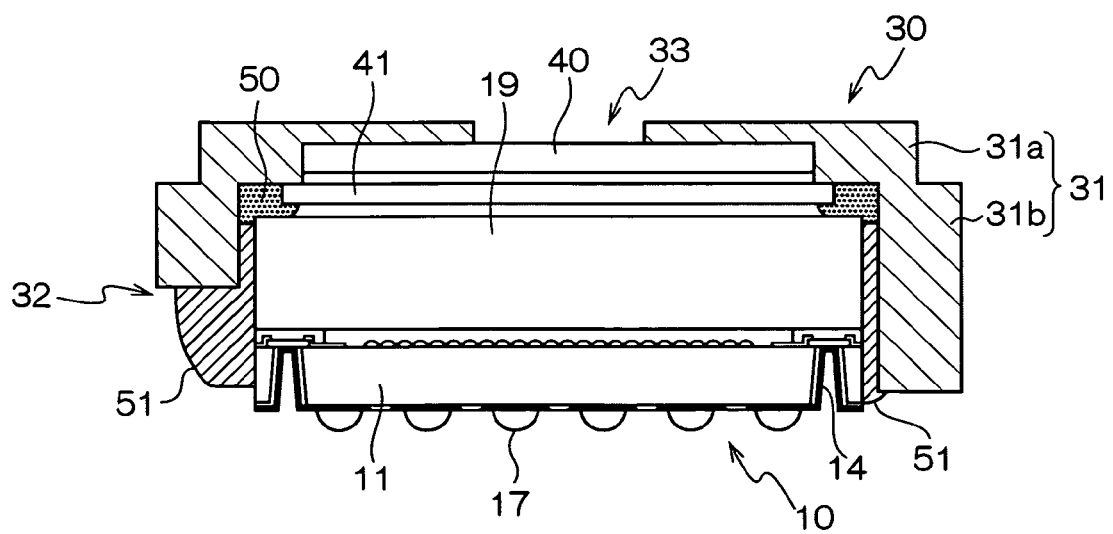
FIG. 2B is a section view along a line 2b-2b in FIG. 2A.
Figure 3A:
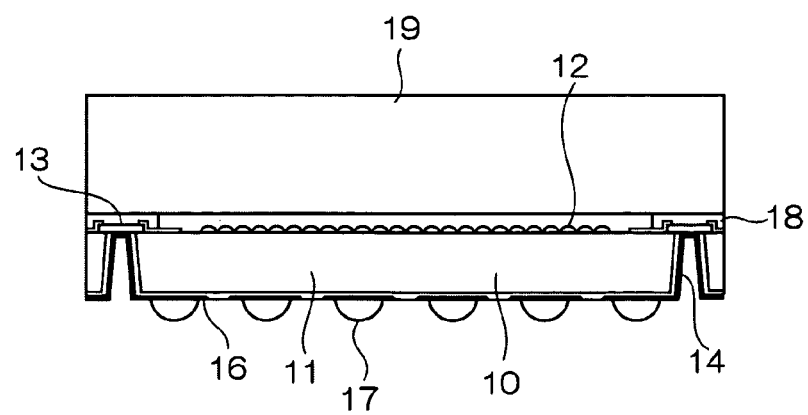
FIG. 3A is a section view showing a configuration of a sensor package configuring the camera module as the example of the invention.
Figure 3B:
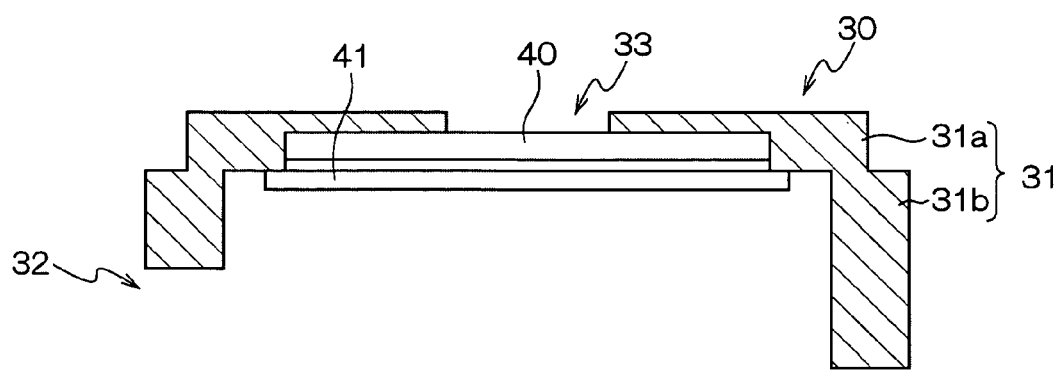
FIG. 3B is a section view showing a configuration of a lens structure configuring the camera module as the example of the invention.

FIG. 1A is a perspective view of a camera module 1 as an example of the invention. FIG. 1B is a side view of the camera module. FIG. 2A is a plan view of the camera module as viewed from a back side thereof. FIG. 2B is a section view along a line 2b-2b in FIG. 2A. FIG. 3A is a section view of a sensor package 10 configuring the camera module 1. FIG. 3B is a section view of a lens structure 30 configuring the camera module 1.

First, a configuration of the sensor package 10 used for the camera module 1 as the example of the invention will be described with reference to FIG. 3A.

The sensor package 10 includes a semiconductor substrate 11 on which many image pickup elements such as CMOS sensors or CCD sensors are formed only at the number of pixels. Each image pickup elements performs photoelectric conversion of converting brightness of light, which is emitted from an imaging object, and focused on a light-receiving surface of the element through a lens 40, into amount of electric charges, and sequentially reads the amount of electric charges and converts it into an electric signal. Then, image data are generated from a position of each image pickup element and a detection output signal from the element. A color filter (not shown) for color separation of light into three primary colors, and a microlens 12 for improving light-receiving sensitivity are provided on the light-receiving surface of the image pickup element. A surface electrode 13 including aluminum, which is electrically connected to the image pickup elements, is formed in the periphery of the light-receiving surface of the semiconductor substrate 11. An optically transparent cover glass 19 is provided on the substrate 11 via a spacer 18. The cover glass 19 protects the image pickup elements formed on the substrate 11 without blocking light irradiated from the imaging object through the lens 40.

The semiconductor substrate 11 includes penetrating electrodes 14 extending from a back surface of the substrate to the surface electrode 13. Each penetrating electrode 14 is formed by covering an inner wall of a through hole, which penetrates the substrate 11 up to the surface electrode 13, by a conductive film including copper. The penetrating electrode 14 is electrically connected to the surface electrode 13 at a bottom of the through hole. Back wiring 16 electrically connected to the penetrating electrodes 14 is formed on a back surface of the semiconductor substrate 11. A sidewall of each through hole and a back surface of the semiconductor substrate 11 are covered with an insulating film, and thus the penetrating electrodes 14 and the back wiring 16 are isolated from the substrate 11. Plural solder bumps 17 as external connection terminals, which configure joints to a mounting board, are formed on ends of the back wiring 16 respectively. The solder bumps 17 are arranged in a grid pattern on the back surface of the semiconductor substrate 11 as shown in FIG. 2A. The solder bumps 17 are electrically connected to the surface electrodes 13 via the back wiring 16 and the penetrating electrodes 14. That is, a detection output signal may be taken from an image pickup element via the solder bumps 17 provided on the back surface of the semiconductor substrate 11, or a bias voltage may be supplied to an image pickup element via the solder bumps 17.

Next, a configuration of the lens structure 30 used for the camera module 1 as the example of the invention will be described with reference to FIG. 3B.

The lens structure 30 is configured of a lens 40, an IR cut filter 41, and a holder member 31 that holds the lens and the cut filter, and has a space for accommodating the sensor package 10 within the member 31.

The lens 40 focuses light from an imaging object onto light-receiving surfaces of the image pickup elements. The lens 40 may be a single lens, or a combination of plural lenses. The lens 40 is fixed to an inner top of the holder member 31. An opening 33 is provided in a top of the holder member 31, and the lens 40 is partially exposed from the opening 33.

The IR cut filter 41 cuts infrared rays included in light from an imaging object, and transmits only visible light. The CCD sensor or the CMOS sensor has sensitivity to infrared rays insensible to human eyes. Therefore, the IR cut filter may allow a detection output signal from the image pickup element to be adjusted to a human visibility characteristic. The IR cut filter 41 is fixed within the holder member 31 at a position by a predetermined distance lower than the lens 40.

The holder member 31 is configured of a lens holder 31a holding the lens 40 and the IR cut filter 41, and a receptacle 31b that is integrally formed with the holder 31a and receives the sensor package 10. The receptacle 31b covers each side face of the sensor package 10, and blocks light injected from a lateral side of the package 10. A bottom of the receptacle 31b is formed as an aperture plane from which the sensor package 10 may be loaded into the receptacle.

As shown in FIG. 1A, an external shape of the holder member 31 is made such that the lens holder 31a has a cylindrical shape in correspondence to an outline of the lens 40, and the receptacle 31b has a rectangular solid shape in correspondence to an outline of the sensor package 10. The lens holder 31a having the cylindrical shape is integrally formed on a top of the receptacle 31b having the rectangular solid shape. Since the camera module 1 is exposed to a high temperature atmosphere in a reflow process performed when it is mounted on a mounting board, heat resistance is required for the holder member 31. As a material forming the holder member 31, for example, polyphenylene sulfide (PPS) resin having excellent heat resistance is preferably used.

An UV irradiation window 32 is provided in each side face of the receptacle 31b of the holder member 31. The UV irradiation window 32 is a through hole for introducing UV light for curing photo-curing resin, which is used for joining the lens structure 30 to the sensor package 10, into the holder member 31. The UV irradiation window 32 is provided in a region near each corner of the rectangular receptacle 31b in correspondence to an application position of the photo-curing resin.

Since the joint of the lens structure 30 to the sensor package 10 exists within the holder member 31, and is not exposed to the outside, the joint has been hardly irradiated with UV light. Therefore, photo-curing resin has not been able to be used for joining the lens structure 30 to the sensor package 10 in the past. In the example, the UV irradiation windows 32 are provided in the holder member 31, thereby UV light may be introduced into the holder member 31. This enables use of photo-curing resin for joining the lens structure 30 to the sensor package 10.

The camera module 1 is configured of the sensor package 10 having the above configuration and the lens structure 30 combined with the sensor package. As shown in FIG. 2B, the sensor package 10 is assembled to the lens structure 30 in a manner of being fitted into the lens structure from the aperture plane formed on an inner bottom side of the receptacle 31b of the holder member 31. The sensor package 10 is fixed to the holder member 31 in such a manner that an upper end face of the cover glass 19 is located by a predetermined distance (for example, 50 μm) lower than the IR cut filter 41. The sensor package 10 is disposed in such a position, so that an optical distance between the sensor package 10 and the lens 40 corresponds to the focal distance of the lens 40. Furthermore, the sensor package 10 is fixed to the holder member 31 in such a manner that a center of an effective pixel area of the image pickup elements corresponds to a light axis of the lens 40.

Two types of resin, photo-curing resin 50 and thermosetting resin 51, are collectively used for joining the sensor package 10 to the lens structure 30. The photo-curing resin 50 is a cure-type composite that is irradiated with light energy of UV light, and thus polymerized and cured in a short time. The photo-curing resin 50 is used in a first joining step where a relative position of the sensor package 10 to the lens structure 30 is fixed. The photo-curing resin 50 is used for joining a top of the cover glass 19 of the sensor package 10 to a bottom (terminal surface) of the receptacle 31b opposed to the top. The photo-curing resin 50 has a property of being cured in a short time by UV irradiation, and need not be heated for curing. Therefore, the resin is suitable for such fixing that a relative position of the sensor package 10 to the lens structure 30 is adjusted, then the adjusted position is fixed while holding the positions. The UV irradiation windows 32 are formed in regions near respective four corners of the inner bottom of the receptacle 31b, the corners being corresponding to application positions of the photo-curing resin 50. UV light for curing the resin 50 is introduced into the receptacle 32b via each UV irradiation window 32.

On the other hand, the thermosetting resin 51 is filled into a space formed between a side face of the sensor package 10 and an inner wall surface of the receptacle 31b. This ensures joining strength of the sensor package 10 to the lens structure 30. Moreover, the sensor package 10 is enclosed within the holder member 31, which ensures air-tightness and a light blocking effect. As the thermosetting resin 51, a black epoxy resin, so-called underfill agent, is preferably used.

As shown in FIG. 2A, solder bumps 17 formed on a bottom of the sensor package 10 are exposed from the aperture plane of the bottom of the holder member 31. The camera module 1 is joined to the mounting board by welding the solder bumps 17 to the board.

In this way, the camera module 1 according to the example of the invention is manufactured by using W-CSP where the sensor package 10 has penetrating electrodes, and has a structure where the lens structure 30 is directly joined to the sensor package 10, leading to small size and low profile. In addition, since the solder balls 17 are formed as external connection terminals on the back side, the camera module may be mounted on a mother board (mounting board) of a mobile phone or the like by batch reflow together with other components.

Next, a method of manufacturing the camera module 1 by combining the sensor package 10 with the lens structure 30, those being configured as the above, will be described with reference to FIGS. 4-a1 to 4-b2.

FIGS. 4-a1, 4-b1 and FIGS. 5-c1, 5-d1 are plan views of the camera module 1 as viewed from a back side thereof for each process step. FIGS. 4-a2, 4-b2 and FIGS. 5-c2, 5-d2 are section views along a line 4a-4a, a line 4b-4b, a line 5c-5c, and a line 5d-5d in FIGS. 4-a1, 4-b1 and FIGS. 5-c1, 5-d1 respectively.

First, the lens structure 30 and the sensor package 10, those being configured as the above, are prepared. Next, an appropriate amount of photo-curing resin 50 is applied to each of four corners of the inner bottom (terminal surface) of the receptacle 31b of the lens structure 30. The photo-curing resin 50 is dropped by, for example, a dispensing method (FIGS. 4-a1, 4-a2).

Next, the sensor package 10 is fitted into the space formed by the receptacle 31b of the lens structure 30 so that a relative position between components is determined. A chip mounter, which is typically used, is used for assembling the sensor package 10 to the lens structure. The sensor package 10 is divided into individual chips, and then each sensor package chip is set on a feeder of the chip mounter. The sensor package 10 fed from the feeder is sucked from a back side thereof by a nozzle of the chip mounter, and thus picked up, and then assembled into the receptacle 31b of the lens structure 30 held on a stage of the chip mounter.

Alignment of the sensor package 10 to the lens structure 30 in an in-plane direction (XY direction) perpendicular to a light axis direction is performed by using image recognition. In the alignment using image recognition, for example, predetermined solder bumps formed on the back of the sensor package 10, and an external shape of a predetermined portion of the lens structure 30 are subjected to image recognition so that a relative position between the bumps and the portion is determined to be within a beforehand set range. It is acceptable that alignment marks are formed on the sensor package 10 and the lens structure 30 respectively, and alignment is performed through image recognition of the marks. Such alignment in the XY direction using image recognition allows the center of the effective pixel area of the image pickup elements to be adjusted to the light axis of the lens 40. The alignment in the XY direction is performed within a range of clearance of about 50 μm in one side, the clearance being provided between the side face of the sensor package 10 and the inner wall surface of the receptacle 31*a*.

Alignment of the sensor package 10 to the lens structure 30 in the light axis direction (Z direction) is performed by using an encoder that detects a position in the Z direction of the nozzle of the chip mounter. Specifically, the sensor package 10 picked up by the chip mounter is temporarily carried to a position where the cover glass 19 contacts to the bottom of the receptacle 31*b* of the lens structure 30 applied with the photo-curing resin 50. Then, based on a detection output signal from the encoder, the sensor package 10 is pulled up by a predetermined distance (for example, 50 μm) from the contact position, so that a clearance of about 50 μm is formed between the IR cut filter 41 provided on the bottom of the receptacle 31*b* and a surface of the cover glass 19. In this way, positioning of the sensor package in the light axis direction (Z direction) is performed in such a manner that a distance from the bottom of the receptacle 31*b* to the surface of the cover glass 19 is constant. Thus, an optical distance between the sensor package 10 and the lens 40 corresponds to the focal distance of the lens 40.

When alignment of the sensor package 10 to the lens structure 30 in each of the XY direction and the Z direction is finished, the chip mounter rests while holding the aligned position (FIGS. 4-*b*1, 4-*b*2).

Next, while holding the relative position of the sensor package 10 to the lens structure 30, the photo-curing resin 50 is irradiated with UV light via the UV irradiation windows 32 so that the resin 50 is cured (first joining step). In the UV light irradiation, for example, light is introduced into the receptacle 31*b* by moving an optical fiber, which is connected to a UV light source, closer to a UV irradiation window 32, or inserting the optical fiber into the window 32. Since the UV irradiation window 32 is provided in a region near each application position of the photo-curing resin 50, UV light is introduced from the window 32, thereby the resin 50 is irradiated with the UV light through the cover glass 19. That is, UV light is introduced from the UV irradiation window 32, thereby the photo-curing resin 50 applied on the inside of the receptacle 31*b* may be completely cured. Such UV irradiation is preferably concurrently performed to respective joints through the four UV irradiation window 32 provided in correspondence to the four corners applied with the photo-curing resin 50 (FIGS. 5-*c*1, 5-*c*2).

In this way, alignment of a relative position of the sensor package 10 to the lens structure 30 is performed by using the chip mounter, then the photo-curing resin 50 is cured while holding the adjusted relative position. Therefore, the sensor package 10 is fixed within the receptacle 31*b* without varying from the aligned position.

In the case that thermosetting resin is used when the relative position of the sensor package 10 to the lens structure 30 is fixed, relatively long heat treatment is necessary for curing the resin. Thus, processing in cooperation with the chip mounter is difficult unlike the example, leading to a possibility that a relative position between components may vary during heat curing. On the other hand, in the example, a relative position of the sensor package 10 to the lens structure 30 is fixed by using photo-curing resin that need not be subjected to heat treatment, which prevents variation in the adjusted relative position due to expansion or deformation of each component during curing the resin. Moreover, UV irradiation time for curing the photo-curing resin 50 is about 10 sec. That is, curing is completed in a shorter time compared with a case that thermosetting resin is used, which enables processing in cooperation with the chip mounter, leading to highly accurate alignment.

Next, the thermosetting resin 51 is applied so as to fill the space formed between the side face of the sensor package 10 and the inner wall surface of the holder member 31. The thermosetting resin 51 is applied by, for example, the dispensing method. The thermosetting resin 51 preferably has a certain degree of viscosity so as to be prevented from leaking from the UV irradiation window 32. Then, the thermosetting resin 51 is cured by heat treatment, for example, at 150° C. for 30 min (second joining step). This ensures joining strength of the sensor package 10 to the lens structure 30. Moreover, the sensor package 10 is enclosed within the lens structure 30, ensuring air-tightness and a light blocking effect (FIGS. 5-*d*1, 5-*d*2).

In this way, the photo-curing resin 50 and the thermosetting resin 51 are used together. The reason for this is as follows. In the case of using only photo-curing resin, the resin is hardly irradiated with UV light for curing photo-curing resin over the whole joint because of such a structural reason that each joint between the sensor package 10 and the lens structure 30 is formed within the receptacle 31*b*, so that an uncured-resin portion may be formed, leading to a possibility that joining strength may not be ensured. On the other hand, in the case of using only thermosetting resin, alignment accuracy of a relative position of the sensor package 10 to the lens structure 30 is hardly ensured as described before. Thus, in the example, the UV irradiation windows 32 are provided, thereby photo-curing resin may be partially used, and the photo-curing resin enabling highly accurate alignment is used in the first joining step for fixing the relative position of the sensor package 10 to the lens structure 30, and thermosetting resin is used in the second joining step for ensuring joining strength.

The above steps are sequentially performed, thereby assembling of the sensor package 10 to the lens structure 30 is completed, and the camera module 1 is produced.

In this way, according to the method of manufacturing the camera module of the invention, alignment of the sensor package 10 to the lens structure 30 in the light axis direction (Z direction), and alignment thereof in the in-plane direction (XY direction) perpendicular to the light axis direction are performed, and then such components are joined to each other while the adjusted relative position between the components is held. Therefore, alignment accuracy of a relative position of the sensor package 10 to the lens structure 30 may be improved. In addition, since the photo-curing resin 50 is used for fixing the relative position, heat treatment is unnecessary, and curing time is short, which enables processing in cooperation with a chip mounter, leading to highly accurate alignment. While a joint between the sensor package 10 and the lens structure 30 exists within the lens structure 30, and is not exposed to the outside, the UV irradiation windows 32 communicating to the inside of the lens structure 30 are provided, thereby UV light may be introduced to the joint within the lens structure, enabling use of photo-curing resin. In addition, since thermosetting resin is collectively used for a portion for which photo-curing resin is hardly used because UV light is structurally hard to be introduced to the portion, joining strength is ensured.

Figure 6A:
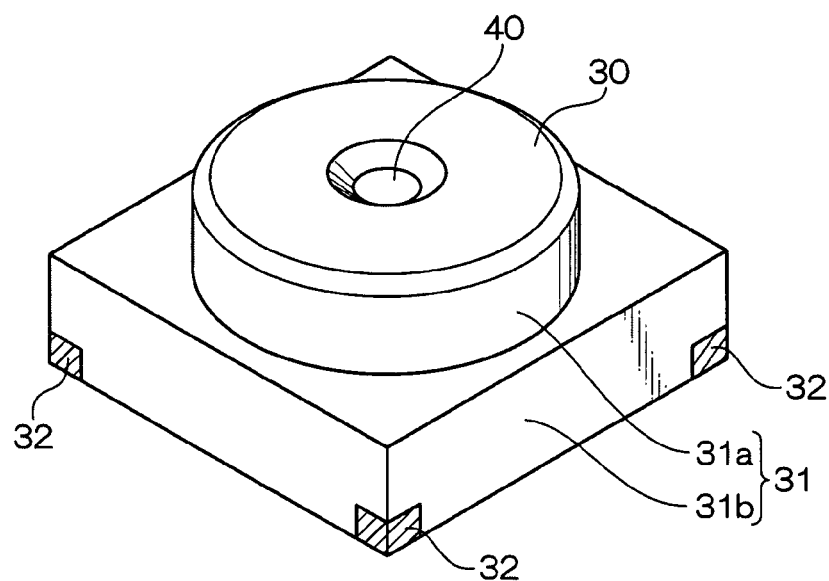
FIG. 6A is a perspective view of a camera module as another example of the invention.
Figure 6B:
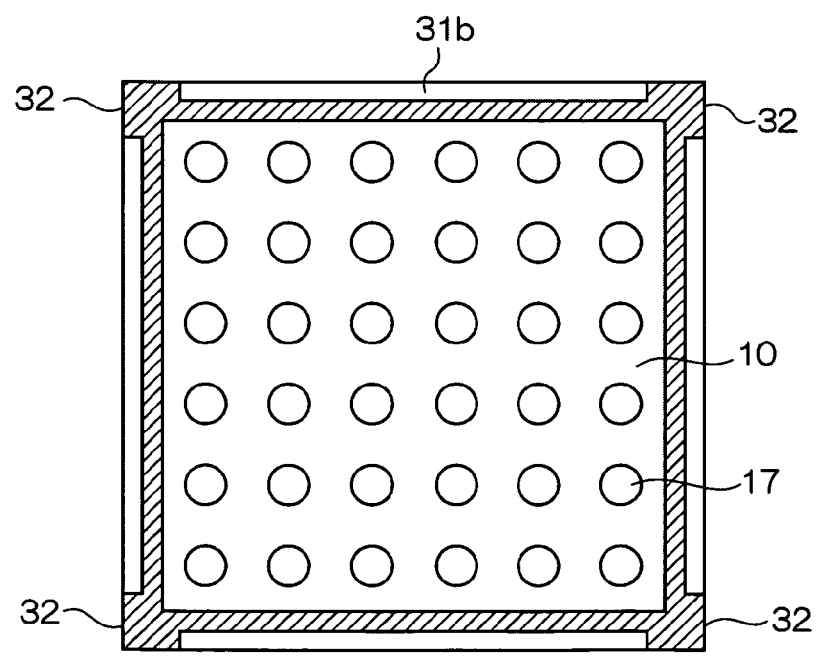
FIG. 6B is a plan view of the camera module as another example of the invention as viewed from a back side thereof.

FIG. 6A is a perspective view of a camera module 1 where a formation position of a UV irradiation window 32 is changed, and FIG. 6B is a plan view of the camera module as viewed from a back side thereof. As shown in FIGS. 6A, 6B, the UV irradiation windows 32 formed in the lens structure 30 may be located at four corners of the rectangular receptacle 31b respectively. The UV irradiation windows 32 are formed in such positions, thereby the photo-curing resin 50, which is applied to each corner of the bottom of the receptacle 31b as shown in FIG. 4-a1, may be uniformly irradiated with UV light. However, if the UV irradiation windows 32 are formed in such positions, leakage of the photo-curing resin 50 or the thermosetting resin 51 tends to occur. Therefore, in the example, the UV irradiation window 32 is formed in each sidewall of the receptacle 3b in a region near the corner. In addition, the U irradiation window 32 is not limited to one shown in the example, and a formation position, number, size, a shape and the like thereof may be appropriately changed depending on an application position or application amount of the photo-curing resin 50.

What is claimed is:

1. A method of manufacturing a camera module comprising a sensor package having an image pickup element, and a lens configuration in which a lens holder, which holds a lens that focuses light from an imaging object onto a light receiving surface of the image pickup element, and a receptacle, which accommodates the sensor package, are integrally formed, the sensor package being fixed within the receptacle, the method comprising:
   applying a photo-curing resin to predetermined portions of the receptacle;
   performing alignment of a relative position of the sensor package to the lens configuration;
   a first joining whereby the photo-curing resin is cured so that the sensor package is fixed within the receptacle while maintaining the relative position of the sensor package to the lens configuration; and
   a second joining whereby a thermosetting resin is applied so as to fill a space formed between the sensor package and the lens configuration, and then curing the thermosetting resin;
   the lens configuration having through holes that are formed at side surfaces of the receptacle in a horizontal direction of the receptacle.

2. The method of manufacturing a camera module according to claim 1, wherein:
   the through holes communicate with the inside of the receptacle; and
   the first joining includes irradiating the photo-curing resin with light through the through holes.

3. The method of manufacturing a camera module according to claim 2, wherein the irradiating of the photo-curing resin with light through the through holes is performed using an optical fiber.

4. The method of manufacturing a camera module according to claim 2, wherein:
   the photo-curing resin is applied to a plurality of portions on a surface of the receptacle, the surface of the receptacle facing a light receiving surface of the sensor package; and
   the first joining includes light irradiation simultaneously performed through the respective through holes provided at positions corresponding to respective application positions of the photo-curing resin.

5. The method of manufacturing a camera module according to claim 1, wherein the performing of alignment includes:
   adjusting the relative position of the sensor package to the lens configuration in a light axis direction; and
   adjusting the relative position in an in-plane direction perpendicular to the light axis direction.

6. The method of manufacturing a camera module according to claim 1, wherein the sensor package is a wafer-level chip size package having a penetrating electrode.

* * * * *